United States Patent [19]

Kawata et al.

[11] Patent Number: 4,927,897

[45] Date of Patent: May 22, 1990

[54] METAL-CONTAINING ORGANIC POLYMER AND USE THEREOF

[75] Inventors: Ken Kawata; Kozo Sato; Masayoshi Tsuboi, all of Kanagawa, Japan

[73] Assignee: Fuji Photo Film Co., Ltd., Kanagawa, Japan

[21] Appl. No.: 214,062

[22] Filed: Jul. 1, 1988

[30] Foreign Application Priority Data

Jul. 2, 1987 [JP] Japan ................ 62-166116

[51] Int. Cl.$^5$ ............................................ C08F 38/00
[52] U.S. Cl. .................... 526/240; 526/285; 502/159
[58] Field of Search ............ 526/240, 285; 252/519, 252/521; 502/159

[56] References Cited

U.S. PATENT DOCUMENTS 4,349,664  9/1982  Matsumura ................ 528/285
4,481,132 11/1984  Dubois et al. ............ 252/521

*Primary Examiner*—Joseph L. Schofer
*Assistant Examiner*—Jeffrey T. Smith
*Attorney, Agent, or Firm*—Sughrue, Mion, Zinn, Macpeak & Seas

[57] ABSTRACT

A metal-containing organic polymer produced by the step of polymerizing a compound represented by formula (I):

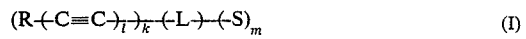

wherein

S represents a hydrogen atom, a hydroxy group, an amino group, a mercapto group, a polyoxyether group, a polyaminoether group, a polythioether group, a sulfino group or a salt thereof, a sulfo group or a salt thereof, a carboxyl group or a salt thereof or a polymerizable group;

R represents a metallic atom, a hydrogen atom, or a group —COOM wherein M represents a hydrogen atom or a metallic atom;

provided that when R represents a carboxyl group or a hydrogen atom, said compound represented by formula (I) is polymerized in the presence of a metallic salt;

L represents a chemical bond or a group having a valency of $(k+m)$; and l, k and m each represents an integer of 1 or more.

24 Claims, No Drawings ered with an aldehyde as described, e.g., in U.S. Pat. No. 2,533,454. However, because this method is diffi-
METAL-CONTAINING ORGANIC POLYMER AND USE THEREOF

FIELD OF THE INVENTION

The present invention relates to a metal-containing organic polymer and the use thereof.

BACKGROUND OF THE INVENTION

Hitherto, it has been proposed to polymerize by heating an acetylene compound in the presence of silver or palladium. However, an acetylene compound which is used conventionally is generally difficult to dissolve in water and organic solvents, and thus the procedures for polymerization reaction are troublesome.

In order to produce films and fibers of a polymer, methods are generally employed in which a solution comprising an organic solvent and a reaction composition dissolved therein is cast on a support or drawn from a nozzle. If the reaction composition is difficult to dissolve in the solvent, the above methods cannot be employed or, at least, the films and fibers obtained are inferior in uniformity.

A silver mirror surface, particularly a mirror presently used, is generally produced by chemical plating in which an ammoniacal solution of silver nitride is reduced with an aldehyde as described, e.g., in U.S. Pat. No. 2,533,454. However, because this method is difficult to control, a thin silver film having a thickness of about 0.1 μm and light transmission cannot be produced easily, and maintenance of a silver plating bath is difficult.

Recently, in view of the easiness of controlling the reaction, physical methods such as vapor deposition and sputtering are employed for producing a thin metallic film such as a thin silver film. However, these physical methods such as vapor deposition and sputtering are generally expensive in the manufacturing device, and thus costs of the product become disadvantageously high.

Compounds containing Group IB or VIII elements are known to be usable as a catalyst for activating a nonmetal surface in a wet chemical plating process which uses no electrode (as described in JP-A-No. 57-43977 (the term "JP-A" as used herein means an "unexamined published Japanese patent application"), and DE No. 2,934,580).

A conventional process for forming a metal coat on a non-conductive or semiconductive base without utilizing electric energy involves the steps of, in sequence, cleaning a base surface, soaking the base in a bath containing stannous chloride or another stannous salt, washing the resulting base, soaking the base in a bath containing such a metal salt as to accelerate the deposition of a desired metal (e.g., silver nitrate, gold chloride, palladium chloride, or platinum chloride), reducing the metal ion of the above-described bath with the stannous ion adsorbed on the base and/or a reducing agent contained in a metal salt bath for nonelectrode plating which is to be applied to the next step to obtain a catalytically activated surface, and treating the catalytically activated surface with a solution containing the desired metal in the presence of the reducing agent (or treating with the metal salt bath for nonelectrode plating) to deposit the desired metal, e.g., copper, nickel, and cobalt. This process and processes analogous thereto are generally called "ionizing activation".

On the other hand, German Patent Publication No. 1,197,720 describes a process of activating the surface of a polymer base upon plating thereof. According to this process, a colloidal solution of metallic palladium is prepared by introducing tin(II) chloride into a chloric acid/palladium chloride solution. This colloidal solution is supposed to be stabilized by stannic acid and tin(IV) oxychloride. Therefore, this process is generally called "colloidal activation". These colloidal particles are deposited on the base surface, and, in the subsequent step, they are activated by an acid, alkali or salt present in an appropriate concentration, whereby they are converted to palladium particles through the removal of the protective colloid to result in formation of a catalytically activated surface on the base. These palladium particles act as catalyst nuclei for nonelectrode copper or nickel plating to be performed in the next step.

In this process, it is necessary to perform a washing step between every two subsequent steps.

However, these conventional activation processes have the following defects.

First, several processing steps (including activation, sensitization, washing and the like) are required for completion of a catalytically activated surface which is applicable to nonelectrode plating, which renders the process complex and expensive.

Second, the range of application of these processes is not wide. In general, application of these processes is limited, if anything, to bases of which surfaces have received a pretreatment using a chemical or mechanical means. Such a pretreatment of a base as described above, which needs to be carried out prior to chemical plating and subsequent electroplating, is also described in R. Weiner, *Kunststoff Galvanisierung* (Eugen G. Lewze Verlag, Saulgauwelt, 1973).

This pretreatment generally includes etching the surface of a base (made from a polymer in many cases) with, e.g., chromium sulfate, detoxicating with a dilute solution of sodium hydrogen sulfite as a washing step is interposed several times, and further washing the resulting surface. After the pretreatment as described above, an appropriate activation treatment like the foregoing ionizing or colloidal activation is carried out.

The etching step changes the surface of a polymer base to result in formation of bites and voids. This effect can be obtained only when the base is made from a particular polymer. Examples of such a particular polymer include ABS polymer, binary phasic multicomponent graft polymers or copolymers like shock resistant polystyrenes, and binary phasic homopolymers like partly crystalline polypropylenes. In addition, the use of chromium sulfate or other oxidizing agents is attended by deterioration of physical properties of a polymeric substance constituting a base, such as a strength to notch shock and an electric surface resistance.

For enhancing adhesiveness of catalyst nuclei to a base, there are methods disclosed in JP-A-Nos. 57-43977, 58-104170 and 61-15984, which involve using metal complexes of the kind which contain both a group capable of entering into combination with a metal and a group having an affinity to a base in a molecule. However, such methods fail to provide satisfactory adhesiveness, because their adhesion power arises basically from adsorption of the metal complexes to the base.

Third, when metallic particles like metallic palladium are densely arranged (even though on a part of the surface), an undesirable connection occurs in forming a printed circuit pattern by nonelectrode plating. Because of the apprehension of connection, the full additive process, though a simple process for producing a base plate for a printed circuit, is not suitable for use. Under these circumstances, production processes which require complex steps, such as the subtractive process and the semiadditive process, are generally used.

SUMMARY OF THE INVENTION

An object of the present invention is to provide a polymer containing a metallic colloid in a high concentration which can be produced easily.

Another object of the present invention is to provide an inexpensive silver mirror film which can be produced easily.

Still another object of the present invention to provide a novel catalyst film for nonelectrode plating.

Yet another object of the present invention to provide a novel method for activating the surface of a base by forming a highly active catalyst film thereon in carrying out nonelectrode plating.

Other objects and effects of the present invention will be apparent from the following description.

The above objects of the present invention are attained by a metal-containing organic polymer produced by the step of polymerizing a compound represented by formula (I):

  (I)

wherein

S represents a hydrogen atom, a hydroxy group, an amino group, a mercapto group, a polyoxyether group, a polyaminoether group, a polythioether group, a sulfino group or a salt thereof, a sulfo group or a salt thereof, a carboxyl group or a salt thereof or a polymerizable group;

R represents a metallic atom, a hydrogen atom, or a group —COOM wherein M represents a hydrogen atom or a metallic atom;

provided that when R represents a carboxyl group or a hydrogen atom, said compound represented by formula (I) is polymerized in the presence of a metallic salt;

L represents a chemical bond or a group having a valency of (k+m); and l, k and m each represents an integer of 1 or more.

The above objects of the present invention are also attained by a catalyst film for nonelectrode plating comprising a polymer produced by the step of polymerizing (1) a compound represented by formula (I):

  (I)

wherein

S, L, l, k and m have the as define above; and

R represents a Group IB metal atom or a Group VIII metal atom; or (2) a mixture of (a) a compound represented by formula (I):

  (I)

wherein

S, L, l, k and m have the same meaning as defined above; and

R represents a carboxyl group or a hydrogen atom; and (b) a salt of a Group IB metal atom or a Group VIII metal atom.

DETAILED DESCRIPTION OF THE INVENTION

Examples of the metallic atom involved in R or a metallic atom constituting the metallic salt include Group I elements other than hydrogen (alkali metals and copper family elements), Group II elements (alkaline earth metals and zinc family elements), Group III elements other than boron, Group VIII elements (iron family elements and platina family elements), Group VA elements, Group VIA elements, Group VIIA elements, antimony, bismuth, and polonium.

Examples of the group having a valency of (k+m) represented by L include a substituted or unsubstituted alkylene group, a substituted or unsubstituted arylene group, a substituted or unsubstituted aralkylene group, a substituted or unsubstituted vinylene group, a substituted or unsubstituted cycloalkylene group, a substituted or unsubstituted glutaroyl group, a substituted or unsubstituted phthaloyl group, a substituted or unsubstituted hydrazo group, a substituted or unsubstituted ureylene group, a thio group, a carbonyl group, an oxy group, an imino group, a sulfinyl group, a sulfonyl group, a thiocarbonyl group, an oxazolyl group, an azo group.

Preferred examples of the group represented by S include a polyoxyether group, a polyaminoether group, and a polythioether group. More preferably, S represents a polyoxyether group.

Specific examples of preferred compounds represented by formula (I) are shown below, but the present invention is not to be construed as being limited to these examples.

  (1)

  (2)

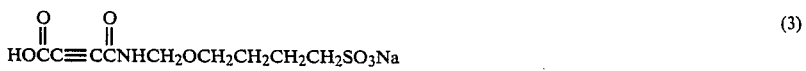  (3)

  (4)

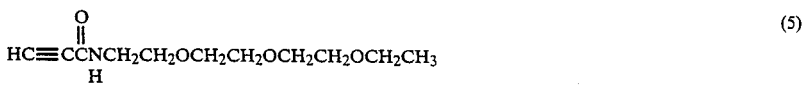  (5)

-continued $$HC\equiv CCH_2\overset{H}{N}CH_2CH_2\overset{H}{N}CH_2CH_2\overset{H}{N}CH_2CH_2\overset{H}{N}CH_2CH_3 \quad (6)$$

$$HC\equiv CCH_2SCH_2CH_2SCH_2CH_2SCH_2CH_2SCH_3 \quad (7)$$

$$(HC\equiv CCH_2O-CH_2)_3\!C-CH_2OCH_2CH_2OCH_2CH_2OCH_2CH_2OCH_2CH_2OCH_2CH_3 \quad (8)$$

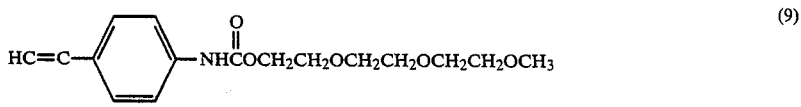

(9)

$$HOOC\!-\!C\equiv C\!-\!C\equiv C\!-\!(CH_2)_8CO_2H \quad (10)$$

$$CH_2\!=\!CHCNHCH_2OCH_2CH_2OCH_2CH_2OCH_2C\equiv CH \quad (11)$$
$$\phantom{CH_2\!=\!CHC}\overset{O}{\|}$$

$$CH_2\!=\!CH-COCH_2CH_2OCH_2CH_2OCH_2CH_2OCH_2C\equiv CH \quad (12)$$
$$\phantom{CH_2\!=\!CH-C}\overset{O}{\|}$$

$$HC\equiv C-CH_2OCH_2CH_2OCH_2CH_2OCH_2CH_2OCH_2C\equiv CH \quad (13)$$

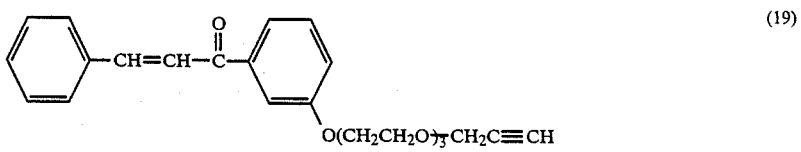

(14)

(15)

$$CH_3CH_2C(\!-\!CH_2OCH_2C\equiv CH)_3 \quad (16)$$

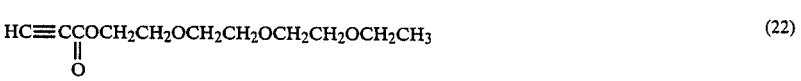

(17)

$$HC\equiv CCH_2OCH_2CH_2OCH_2CH_2OCH_2CH_2OH \quad (18)$$

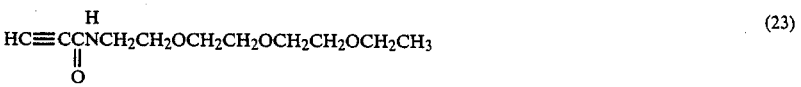

(19)

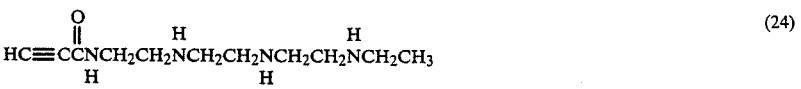

(20)

$$HC\equiv CCH_2OCH_2CH_2OCH_2CH_2OCH_3 \quad (21)$$

$$HC\equiv CCOCH_2CH_2OCH_2CH_2OCH_2CH_2OCH_2CH_3 \quad (22)$$
$$\phantom{HC\equiv CC}\underset{O}{\|}$$

$$HC\equiv C\overset{H}{C}\!N\!CH_2CH_2OCH_2CH_2OCH_2CH_2OCH_2CH_3 \quad (23)$$
$$\phantom{HC\equiv CC}\underset{O}{\|}$$

$$HC\equiv C\overset{O}{\overset{\|}{C}}\!N\!CH_2CH_2\overset{H}{N}CH_2CH_2\overset{H}{N}CH_2CH_2\overset{H}{N}CH_2CH_3 \quad (24)$$
$$\phantom{HC\equiv CC}\underset{H}{\phantom{N}}\phantom{CH_2CH_2}\underset{H}{\phantom{N}}$$

$(HC\equiv CCH_2O-CH_2)_3C-CH_2OCH_2CH_2OCH_2CH_2OCH_2CH_2OCH_2CH_3$ (25)

$$CH_2=CH-\overset{\overset{O}{\|}}{C}OCH_2CH_2OCH_2CH_2OCH_2CH_2OCH_2C\equiv CH$$ (26)

$HC\equiv CCH_2OCH_2CH_2OCH_2CH_2OCH_2CH_2OCH_2C\equiv CH$ (27)

$HC\equiv CCH_2SCH_2CH_2SCH_2CH_2SCH_2CH_2SCH_2CH_3$ (28)

$HC\equiv C-C\equiv C-(CH_2)_{20}-CO_2H$ (29)

$$HC\equiv C-C\equiv C-(CH_2)_3\underset{\underset{O\mbox{$+$}CH_2CH_2O\mbox{$)_6$}H}{|}}{CH}-C_{15}H_{31}$$ (30)

$HC\equiv C-CH_2OCH_2CH_2OCH_3$ (31)

These acetylene compound represented by formula (I) can be generally synthesized by the following manner.

That is, a compound containing a C—C triple bond, e.g., propionic acid, propargyl bromide, propargyl alcohol, etc., is reacted by a condensation reaction with a compound containing another desired functional group, e.g., tetraethylene glycol monoethyl ether, maleic anhydride, propane sulfone, epichlorohydrin, acrylic acid chloride, etc.

A specific synthesis example of such an acetylene compound as described above is described below.

Synthesis of Compound (1)

A mixture of 107 g of tetraethylene glycol monoethyl ether, 107 g of propargyl bromide and 300 g of anhydrous potassium carbonate was stirred for 20 hours with heating on a water bath. After cooling, insoluble matter was filtered out by passing through Celite, and the filtrate was distilled under reduced pressure. A colorless transparent liquid was obtained in a yield of 120 g. The boiling point thereof was 115° C./3 mm Hg.

Other compounds can also be synthesized with ease in a similar manner.

Furthermore, compounds represented by formula (I) containing a metallic atom as R can be synthesized by reacting an acetylene compound represented by formula:

$$(R+C\equiv C)_{\overline{n}k}(L)_l(S))_m$$

(wherein S, L, l, k and m has the same meaning as in formula (I)) which can be synthesized by the above manner with a metallic salt such as silver nitride, palladium chloride, cuprous chloride and nickel chloride. In this reaction, the above acetylene compound is suspended in water or an appropriate organic solvent, and the above metallic salt are added thereto so as to attain the reaction. At this time, it is preferred that a catalytic amount of cuprous iodide is present in the organic solvent, or the reaction is carried out in methanol in the presence of sodium methoxide. Further, if a stabilizing ligand such as triphenyl phosphine is used, the reaction product can be easily isolated.

The metal-containing acetylene compound thus obtained is an acetylide o-complex or a x-complex as determined by an NMR spectrum and an IR spectrum.

As the metallic element contained in the acetylene compound, silver, palladium, gold and copper are preferred, and silver, palladium and gold are more preferred.

The acetylene compound according to the present invention has a high solubility in organic solvents as it is or as a mixture with a metallic salt. Therefore, a metal-containing polymer in the form of a uniform film or fiber can be easily obtained.

In formula (I), when R represents a hydrogen atom or a carboxyl group, examples of the metallic salt (involving complexes) which is used in combination include silver nitride, silver acetate, silver tetrafluoroborate, palladium chloride, cuprous chloride, platinum chloride, d-μ-chlorobis(η-2-methylallyl)dipalladium(II) complex, tetrakis(triphenylphosphine)palladium complex, di-μ-chlorotetracarbonyldirhodium(I) complex, 1,4,7,10,13-pentaoxycyclododecanesodium tetrachlorovanadinite, and dicyclopentadienegold(I) chloride.

The molar ratio of the compound represented by formula (I) to the metallic salt is preferably from about 1/0.5 to ¼, more preferably from about 1/1 to ½.

As for the methods of synthesizing the polymers of the present invention, any known method, e.g., a radical polymerization method utilizing heat, light, gamma rays, etc., an ionic polymerization method, polymerization methods utilizing transition metal complexes as catalysts, or the like can be employed. These polymerization methods have been reported in a great number of papers and reviews (e.g., *Usp. Khim.*, vol. 45, No. 4. pp. 695 to 741 (1976)).

In recent years also, polymerization methods for polymers having conjugated unsaturated bonds have been developed and reported with the development of conductive polymers and the advance of research into light recording materials, as described for instance, in *Macromolecules*, vol. 14, No. 2, pp. 233 to 236 (1981), *J. Am. Chem. Soc.*, vol. 102, No. 27, pp. 7940 to 7944 (1980) and JP-A-No. 61-137781.

The polymerization degree of these polymers depends on their synthesis condition, or the structures of monomers used. Therefore, a polymerization degree can be selected, from oligomers to high polymers.

In the present invention, polymerization methods using heat are preferred. Specifically, by contacting a film of the monomer (i.e., a compound of the present invention) coated on a support base to a heat plate, irradiating with infrared ray, or irradiating with laser beam, so as to heat the monomer to from about 100° C. to 400° C., and thus the polymerization is carried out.

When a compound represented by formula (I) wherein R is silver, cobalt, nickel or chromium, or a mixture of a compound represented by formula (I) wherein R is a carboxyl group or a hydrogen atom and a salt of silver, cobalt, nickel or chromium is polymerized, a film having a high reflection can be obtained. In this case, the heating temperature for polymerization is preferably from about 80° C. to 200° C.

In the present invention, polymerization can be carried out after dissolving the compound of formula (I) and optionally a metallic salt in water or an organic solvent. The organic solvent is not limited while dissolving the metallic salt, one examples thereof include methanol; ketones such as acetone and methyl ethyl ketone; halides such as chloroform and methylene chloride; esters such as ethyl acetate; amides such as dimethylacetoamide, dimethylformamide and N-methyl-2-pyrrolidone; and nitriles such as acetonitrile.

This solution can be coated on a support base and the polymerization can be carried out.

The concentration of the monomer represented by formula (I), particularly a silver salt monomer which is preferably used in the present invention, in the polymerization solution is not limited. However, in view of the uniformity of the film formed by the polymerization, it is preferably from about 1 to 50 wt% based on the amount of the solution.

In addition, the above solution may further contain a binder and a copolymerizable monomer (comonomer) if desired.

The amount of the binder is preferably 10 times by weight or less the amount of the compound of formula (I).

Examples of the binder include natural polymers involving proteins such as gelatin; polysaccharides such as cellulose derivatives and dextran; and gum arabic; and synthetic polymer involving polyvinyl butyral, polyvinyl acetate, ethyl cellulose, vinylidene chloride-vinyl chloride copolymers, polymethyl methacrylate, vinyl chloride-vinyl acetate copolymers and cellulose acetate butyrate.

Examples of the comonomer which may be used in combination upon polymerization by heat are listed below.

 (C-1)

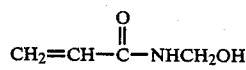 (C-2)

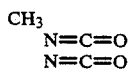 (C-3)

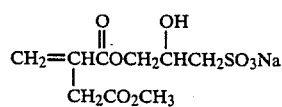 (C-4)

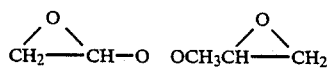 (C-5)

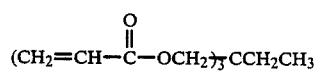 (C-6)

 (C-7)

-continued

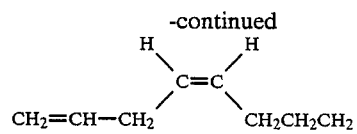 (C-8)

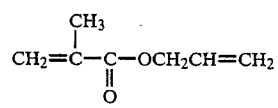 (C-9)

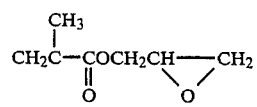 (C-10)

The metal-containing polymer according to the present invention may be in the form of film, particle or fiber, and the form of film provided on a support base is preferred.

As for the method of forming a thin film on a base, a vacuum evaporation method, a Langmuir-Blodgett method, a coating method and so on can be employed in keeping the foregoing acetylene compounds on the base.

Vacuum evaporation can be effected according to the following general method: A diacetylene monomer is evaporated by heating directly with a coil or boat made of W, Mo, Ta or the like, or indirectly when placed in a crucible made of quartz, alumina, beryllia or the like. Heating may be performed by using a resistance induced heater, a high frequency heater, or so on. The heating temperature, though selected depending on the characteristics of the diacetylene monomer used, is generally higher than its melting point, and the pressure inside the vacuum system is generally controlled to about $10^{-3}$ Torr or below.

General processes of forming a monomolecular film and cumulating it according to Langmuir-Blodgett film-forming method are described, e.g., in *Shin-Jikken Kagaku Kohza*, edited by Chemical Society of Japan, volume 18, entitled "Interface and Colloid", chapter 6, published Maruzen.

Water to be used is passed through ion exchange resins, and organic substances are removed with potassium permanganate, and then the resulting water is distilled. Water temperature is about 15° C. to 20° C. To the distilled water, an ion like $Cd^{2+}$ is added in an amount of about $10^{-3}$ to $10^{-4}$ mol/l, if needed. Purified monomers are dissolved in chloroform for spectral analysis use, in a concentration of about 0.5 to 1.0 mg/ml. After forming a monomolecular film, the cumulation on the base is performed as the surface pressure is kept at about 20 to 25 dyne/cm.

In a coating process, on the other hand, a monomer solution or suspension is coated on a base using a curtain, dip, spray, spinner or another conventional coating method. Such coating methods have no particular restriction as to the solvent to be used and a concentration thereof. Taking into account the uniformity of a thin film to be formed, however, solvents having high solubility are preferred. Representative solvents are water, methanol, ketones such as acetone, methyl ethyl ketone, etc., halogen compounds such as chloroform, methylene chloride, etc., esters such as ethyl acetate, etc., amides such as dimethyl acetamide, dimethyl formamide, N-methyl-2-pyrrolidone, etc., and nitriles such as acetonitile, etc.

In providing a protective layer on the thin film of the present invention, or sticking two thin films together, known arts can be applied.

As an instance of catalyst film preparations to which the foregoing methods are applied, the preparation utilizing the Langmuir-Blodgett method described in JP-A-No. 61-137781 can be cited. Therein, a monomer having affinity to both media, e.g., Compound (29), is made into monomolecular films cumulated on a base, irradiated with UV light emitted from a high pressure mercury lamp to undergo polymerization, and then soaked in a bath of Group IB or VIII metal salt.

The above-cited method is a topochemical polymerization utilizing the orientation of the acetylenic bonds.

As a further general example of polymerization methods, mention may be made of the method in which a chloroform solution containing azobisisobutylonitrile as a thermal polymerization initiator and Compound (11) is coated on a polymethylmethacrylate base using a spin coating method, heated (e.g., at 80° C. for 40 min.), and the soaked in a bath of Group IB or VIII metal salt.

The metal salts introduced into the films according to the foregoing methods are reduced to metals with a reducing agent contained in a nonelectrode plating bath, or by applying a reducing bath prior to the nonelectrode plating bath.

As a method different from the above-described ones, there can be cited the method in which a compound forming a complex together with Group VIII or IB metal, such as silver acetylide of Compound (1), is used as a polymer-forming monomer, coated on a base using a spin coating method or so on, and then heated or irradiated with UV light to undergo polymerization. According to this method, metals are obtained in a sufficient quantity to function as a catalyst for nonelectrode plating by application of heat or irradiation with UV light. Though part of the metal complexes remain unchanged in some cases, they also come to function as catalytic nuclei due to the action of a reducing agent contained in the nonelectrode plating bath. Thus, a thin film having a thickness of the submicron order and a catalytic function for nonelectrode plating, in which fine particles of a metal to function as catalytic nuclei are homogeneously dispersed among polymer molecules containing conjugated unsaturated bonds, can be easily formed on a nonconductive base.

In the present invention, the polymer containing C—C unsaturated bonds is preferably used in an amount of about 1 mg to 10 g, particularly about 20 mg to 1 g, per square meter of a base. A suitable thickness of the thin film made from this polymer alone or the combination of this polymer with another binder ranges from about 0.001 to 5 $\mu$m, particularly from about 0.005 to 0.5 $\mu$m.

A preferred content of the simple substance, complex or salt of the Group VIII or IB metal in the thin film of the foregoing polymer(s) is about 5 to 5,000 parts by weight, particularly about 10 to 500 parts by weight, per 100 parts by weight of the polymer of the present invention.

As for the metallic elements to become catalytic nuclei, noble metals, such as copper, silver, gold, palladium and platinum are preferred over other metals belonging to the Group VIII or IB.

Examples of preferred metal salts include silver nitrate, palladium chloride, cuprous chloride, platinum chloride, and those of preferred metal complexes include di $\mu$-chlorobis($\eta$-2-methylallyl)dipalladium(II) complex, tetrakis(triphenylphosphine)palladium complex, di-$\mu$-chlorotetracarbonyldirhodium(I) complex, and dicyclopentadienegold(I) chloride.

Examples of the base materials suitable for the present invention, which are not particularly limited and can be selected freely from those known in the art, include copper, iron, titanium, glass, quartz, ceramics, carbon, paper, polyethylene, polyphenol, polypropylene, ABS polymer, epoxy resin, and polyester. Further examples of the bases include textile fabrics, sheets, threads and fibers of polyamides, polyolefins, polyacrylonitrile, polyvinyl halides, cotton, wool, mixtures of two or more thereof, and copolymers prepared from two or more monomers which constitute the above-described resins.

Among the above materials, a plastic film, paper and an epoxy resin are preferred.

A nonelectrode plating bath used in the present invention preferably contains a nickel salt, a cobalt salt, gold salt, silver salt, or a mixture of any two of them, or a mixture of any one of them and an iron salt. Plating baths of the above-described kind are well known in the art of nonelectrode plating. The present invention is not to be construed as being limited to these baths, but such a plating bath as to contain an inactive substrate and to precipitate the substrate together in the coat formed by plating can be also utilized.

The metal-containing polymer of the present invention can be applied to a highly reflective film, a heat radiation reflecting film, an electroconductive film, a printed wiring board, an electromagnetic radiation shielding film and the like.

The present invention is now described in greater detail with reference to the following examples, which are not to be construed as limiting the scope of the present invention. Unless otherwise indicated, all parts, percents and ratios are by weight.

EXAMPLE 1

140 mg of Compound (1) and 105 mg of silver nitride were completely dissolved in 5 ml of methanol, and the thus obtained solution was spin-coated on a glass base at 1,500 cpm. The coated material was heated on a heating plate of 120° C. for 20 minutes so as to obtain a water insoluble polymer film.

The thus obtained polymer film showed light reflection property due to the metallic component contained therein. The transmission ratio and the reflectivity of a visible light (500 nm) of the polymer film were 0.24 and 0.44, respectively.

The polymer film had a surface resistance of 20 M$\Omega$/cm$^2$ After the polymer film was soaked in 1N HCl aqueous solution containing 500 ppm of PdCl$_2$, the surface resistance decreased to 10 to $10^3$ $\Omega$/cm$^2$, i.e., the polymer film became a high electroconductive film.

EXAMPLE 2

The solution obtained in Example 1 was coated on a PET film which is previously treated with chromic acid so as to be hydrophilic. The coated material was placed in an oven at 120° C. for 20 minutes to obtain a film having a high reflectivity. The transmission ratio and the reflectivity of a visible light (500 nm) of the film were 0.22 and 0.40, respectively.

EXAMPLE 3

148 mg of Compound (18), 105 mg of silver nitride and 120 mg of Comonomer (C-2) were completely dissolved in 5 ml of methanol, and the thus obtained solution was spin-coated on a glass base at 1,500 cpm. The coated material was heated on a heating plate of 150° C. for 15 minutes so as to obtain a polymer film as a highly reflective silver mirror. The transmission ratio and the reflectivity of a visible light (500 nm) of the film were 0.22 and 0.38, respectively.

EXAMPLE 4

148 mg of Compound (1), 105 mg of silver nitride and 200 mg of gelatin were completely dissolved in 5 ml of water, and the thus obtained solution was spin-coated on a glass base at 1,500 cpm. The coated material was heated on a heating plate of 150° C. for 15 minutes so as to obtain a polymer film as a highly reflective silver mirror. The transmission ratio and the reflectivity of a visible light (500 nm) of the film were 0.18 and 0.33, respectively.

EXAMPLE 5

The silver salt of Compound (1) was prepared as follows:

Under a light-intercepting condition, 16.4 g of sodium acetate and 16.7 g of silver acetate were suspended in 200 ml of distilled water. Thereto, 20.1 g of Compound (1) was added dropwise, and stirred for 20 minutes, and then cooled to room temperature. The resulting mixture was neutralized with 7.8 g of sodium hydrogen carbonate, and the supernatant solution was removed therefrom by decantation. To the residue were added 200 ml of water and 400 ml of chloroform to extract the product therewith. The chloroform phase was dried with anhydrous sodium sulfate, and the chloroform was distilled away under reduced pressure, resulting in production of 29 g (almost quantitative yield) of a white waxy solid.

The product was ascertained to be the $\sigma$-complex of silver from the measurements of NMR spectrum and IR spectrum.

NMR: $\delta$: 1.15 (triplet, 3H), 3.0-4.0 (multiplet, 14H), and 3.4 (broad singlet, 2H).

IR: 2860 cm$^{-1}$ (C—H stretching), 1980 cm$^{-1}$ C$\equiv$C stretching), and 1100 cm$^{-1}$ (C—O stretching).

A 0.24 g portion of the silver slat of Compound (1), 0.36 g of distilled water, and 1.80 g of methanol were mixed and dissolved to be made into a solution having a concentration of 10 wt%.

A 1 ml portion of this solution was dropped onto a PET (Polyethylene terephthalate) base measuring 4.5 cm $\times$7 cm in size, and coated thereon in a thin layer from using a spin coating method. The resulting base was heated for 15 minutes on a 180° C. hot plate to result in formation of a water-insoluble light brown transparent thin film.

The resulting base was soaked in an alkaline solution for nonelectrode copper plating, which contained 10 g/l of copper sulfate, 15 g/l of Rochelle salt and 20 mol/l of a 37% formaldehyde solution, and was adjusted to pH 12 to 13 with sodium hydroxide.

In the lapse of 20 minutes, a firmly sticked copper layer having metallic luster had been deposited. The surface resistance of the thus formed metallic layer was 4.0 $\Omega$/cm$^2$.

According to the observation of the vertical sectional structure of the foregoing metallized film with a scanning electron microscope, a thickness of the film, except that of the PET base, was 0.3 $\mu$m, and the metallic part was approximately homogeneous and had the same thickness.

To make an additional remark, a thickness of the light brown transparent was 0.1 $\mu$m, and silver particles measuring 50 to 100 Å in size were homogeneously dispersed in the thin film.

EXAMPLE 6

A 0.05 g portion of the silver salt of Compound (I) prepared in Example 5 was dissolved in 2.28 g of distilled water to make a 2 wt% solution thereof. This solution was subjected, in sequence, to the same coating, heating and nonelectrode copper plating procedures as in Example 5, except a wire bar coating method was employed. Thus, a translucent film having metallic copper luster was obtained. The surface resistance of this film was 8.3 $\Omega$/cm$^2$. Although the peeling of this film from the base was attempted using Cello-Tape, no peeling was not caused.

EXAMPLE 7

Compound (6) was converted to the silver salt in the same manner as Compound (1) in Example 5, and a 0.1 g portion thereof was dissolved in 1 ml of chloroform to make a 9 wt% solution thereof. This solution was subjected to, in sequence, the same coating, heating and nonelectrode copper plating procedures as in Example 5. An opaque film having metallic copper luster was obtained. The surface resistance of this metallized film was 1.0 $\Omega$/cm$^2$.

EXAMPLE 8

A 0.2 g portion of the silver salt of Compound (1) prepared in Example 5 and 1.0 g of gelatin were dissolved in 8 ml of distilled water. A 5 ml portion of the solution was coated on a PET base using a wire rod. After air-drying the resulting base was allowed to stand for 15 minutes on a 180° C. hot plate. Then, it was soaked in the same nonelectrode copper plating bath as used in Example 5. In the lapse of 40 minutes, a uniform copper coat having metallic luster appeared at the interfacial part contacting with the PET base, but the surface contacting with the liquid showed no electrical connection phenomenon.

EXAMPLE 9

A 0.22 g portion of the silver salt of Compound (I) prepared in Example 5 was dissolved in 1 ml of chloroform, and coated in the same manner as in Example 5. After 40 minutes' exposure to a high pressure mercury lamp, the coated base was soaked in the same nonelectrode copper plating bath a used in Example 5. In the lapse of 20 minutes, a metallic film having copper luster was obtained. The surface resistance of the film was 20 to 38 $\Omega$/cm$^2$.

EXAMPLE 10

Compound (9) was converted to the silver salt thereof in the same manner as in Example 5. A 0.24 g of N-hydroxymethylacrylamide, 1 ml of distilled water and 1 ml of methanol were mixed and dissolved. The resulting solution was coated in the same manner as in Example 5, exposed to a high pressure mercury lamp for 10 minutes, heated at 100° C. for 10 minutes, and then soaked in the same alkaline bath for nonelectrode copper plating as used in Example 5. The surface resistance of the thus obtained metallized film was 150 to 180 $\Omega$/cm$^2$.

EXAMPLE 11

Compound (29) was dissolved in benzene so as to have a concentration of $3\times10^{-3}$ mol/l, adjusted to pH 5.8, and then spread over the water phase of an aqueous solution of cadmium chloride (having a concentration of $1\times10^{-3}$ mol/l). After removal of benzene used as solvent through evaporation, the surface pressure was increased up to 20 dyne/cm.

A glass base having thoroughly cleaned surfaces and sufficiently high affinity to water was employed as a carrier, and it was made to slowly rise and fall in the direction of transversing the surface of the water phase at an up an down speed of 1.0 cm/min as the surface pressure was maintained constant, resulting in transfer of the diacetylene monomolecular films onto the glass base. Thus, a film in which 31 monomolecular layers had been accumulated was obtained. This film was uniformly and adequately irradiated with UV light of 254 nm, whereby the film as a whole was colored in a blue tint.

The blue film-coated base was soaked for 10 minutes in a water solution containing palladium chloride in a concentration of $1\times10^{-3}$ mol/l, an washed thoroughly. Then it was soaked in an alkaline nickel-plating bath containing 30 g/l of nickel chloride, 3 g/l of dimethylaminoborane and 10 g/l of citric acid, and being adjusted to pH 8.1 with an aqueous ammonia. In the lapse of 10 minutes, an effectively sticked nickel layer having metallic luster was deposited. The surface resistance of the nickel layer was 3.8 $\Omega/cm^2$.

EXAMPLE 12

Tris(tetrahydrothiophene)hexachloroditantalum-(III) to be employed as a polymerization catalyst was prepared in accordance with the synthesis method described in *Inorganic Chemistry*, vol. 17, pp. 2293 to 2298 (1978).

A 0.1 g portion of this catalyst was dissolved in 10 ml of toluene, and thereto was added 1.0 g of Compound (1). The resulting solution was coated on a glass base in the form of a thin film according to the same procedure as in Example 5, and heated on a 180° C. hot plate.

The resulting glass base was soaked for 10 minutes in a solution containing palladium chloride in a concentration of $1\times10^{-3}$ mol/l, and then washed thoroughly.

Thereafter, it was soaked for 20 minutes in the same alkaline bath for copper plating as used in Example 5, resulting in the formation of a metallic layer having copper luster. The surface resistance of this metallic layer was 0.5 $\Omega/cm^2$.

EXAMPLE 13

In 10 ml of chloroform were dissolved 10 mg of azobisisobutyronitrile and 1 g of Compound (20). The resulting solution was coated on a glass base using a spin coating method to form a thin film. This film was heated at 100° C. for 30 minutes, and then soaked for 10 minutes in a water solution containing silver nitrate in a concentration of $1\times10^{-2}$ mol/l, followed by thorough washing. Further, the resulting glass base was soaked for 20 minutes in the same alkaline bath for nonelectrode copper plating as use din Example 5. Thus, a metallic layer having copper luster was formed on the glass plate. The surface resistance thereof was 20 $\Omega/cm^2$.

EXAMPLE 14

0.22 g of Compound (1) and 0.17 g of finely ground silver nitride were mixed and stirred for 20 minutes while dispersing with ultrasonic wave, so as to obtain a pale yellow transparent viscous solution. The thus obtained viscous solution was a $\pi$-complex of silver as determined by the NMR spectrum.

The viscous solution was dissolved in 8 ml of methanol, and 1 ml of the obtained solution was dropped on a PET base (4.5 cm $\times$7 cm) to coat as a thin film by spin-coating. The coated material was heated on a heating plate of 180° C. for 15 minutes to obtain a pale yellow transparent thin film. This was soaked in the nonelectrode copper plating solution used in Example5. After 20 minutes, a copper layer having a metallic luster firmly adhered on the base surface was deposited. The surface resistance of the layer was 0.5 $\Omega/cm^2$.

EXAMPLE 15

0.22 g of Compound (1) and 30 g of palladium chloride disodium chloride were mixed with 2 ml of methanol, and the mixture was coated on a glass base in the same manner as in Example 5. The coated material was heated on a heating plate of 80° C.

A nonelectrode cobalt plating bath (pH 9) was prepared by mixing 0.08 mol/l of cobalt sulfate, 0.2 mol/l of sodium hydrogen sulfite, 0.5 mol/l of sodium tartarate, and 0.5 mol/l of boric acid, which is added with NaOH.

The above-prepared coated material was soaked in the nonelectrode cobalt plating bath at 90° C. for 20 minutes, so as to obtain a metallic layer having silver luster. The surface resistance of the metallic layer was 10 $\Omega/cm^2$.

EXAMPLE 16

On a glass base, a film was formed using Compound (31) by vacuum deposition under a pressure of $10^{-3}$ Torr while heating the compound to 300° C. This was soaked in an aqueous solution of palladium chloride having a concentration of $1\times10^{-3}$ mol/l for 10 minutes, and then washed with water. Thereafter, a metallic film having copper luster was formed using a nonelectrode copper plating bath in the same manner as in Example 5. The surface resistance of the metallic film was 2 $\Omega/cm^2$.

As stated in the foregoing, a metal-containing organic polymer can be obtained easily by the present invention. Furthermore, the present invention provides a silver mirror film produced easily and a novel catalyst for nonelectrode plating.

While the invention has been described in detail and with reference to specific embodiments thereof, it will be apparent to one skilled int he art that various changes and modifications can be made therein without departing from the spirit and scope thereof.

What is claimed is:

1. A catalyst film for nonelectrode plating comprising a polymer produced by the step of polymerizing
(1) a compound represented by formula (I):

$$(R+C\equiv C)_n)_k(L)(S)_m \tag{I}$$

wherein
S represents a polyoxyether group, a polyaminoether group, or a polythioether group;
L represents a chemical bond or a group having a valency of (k+m);

l, k and m each represents an integer of 1 or more, and R represents a Group IB metal atom or a Group VIII atom; or (2) a mixture of (a) a compound represented by formula (I):

  (I)

wherein

S, L, l, k and m have the same meaning as defined above; and

R represents a carboxyl group of a hydrogen atom; and (b) a salt or a Group IB metal atom or a Group VIII metal 2. A catalyst film for nonelectrode plating as in claim 1, wherein said group having a valency of (k+m) represented by L is selected from the group consisting of a substituted or unsubstituted alkylene group, a substituted or unsubstituted arylene group, a substituted or unsubstituted aralkylene group, a substituted or unsubstituted vinylene group, or unsubstituted glutaroyl group, a substituted or unsubstituted phthaloyl group, a substituted or unsubstituted hydrazo group, a substituted or unsubstituted ureylene group, a thio group, a carbonyl group, an oxy group, an imino group, a sulfinyl group, a sulfonyl group, a thiolcarbonyl group, an oxazolyl group and an azo group.

3. A catalyst film for nonelectrode plating as in claim 1, wherein S represents a polyoxyether group.

4. A catalyst film for nonelectrode plating as in claim 1, wherein the metallic salt used in polymerization reaction (2) is selected from the group consisting of silver nitride, silver acetate, silver tetrafluoroborate, palladium chloride, cuprous chloride, platinum chloride, d-μ-chlorobis-(-2-methylallyl complex, tetrakis(triphenylphosphine)-palladium complex, di-u-chlorotetracarbonyldirhodium(I)-palladium complex, di-u-chlorotetracarbonyldirhodium(I) complex, 1,4,7,10,13-pentaoxycyclododecanesodium tetrachlorovanadinite, and dicyclopentadienegold(I) chloride, and combinations thereof.

5. A catalyst film for nonelectrode plating as in claim 1, wherein in polymerization reaction (2), the molar ratio of the compound represented by formula (I) to the metallic salt is from about 1/0.5 to ¼.

6. A catalyst film for nonelectrode plating as in claim 5, wherein said molar ratio is from about 1/1 to ½.

7. A catalyst film for nonelectrode plating as in claim 1, the step of polymerizing comprising a polymerization method selected from radical polymerization utilizing head, light or gamma rays, ionic polymerization, and a polymerization method utilizing transition metal complexes as catalysts.

8. A catalyst film for nonelectrode plating as in claim 1, wherein the step of polymerizing comprises a polymerization method using heat.

9. A catalyst film for nonelectrode plating as in claim 8, said polymerization method comprising coating a compound of formula (I) on a support base, and heating the film to a temperature of from about 100° C. to 400° C. to carry out polymerization.

10. A catalyst film for nonelectrode plating as in claim 9, wherein said heating comprises contacting the film with a heat plate, irradiating the film with infrared rays or irradiating the film with a laser beam.

11. A catalyst film for nonelectrode plating as in claim 9, wherein in polymerization reaction (2), and a salt of silver, cobalt, nickel or chromium is used as the metallic salt, a film having a high reflection is obtained by heating the film at a temperature of from about 80° C. to 200° C.

12. A catalyst film for nonelectrode plating as in claim 1, wherein the step of polymerizing is carried out after dissolving the compound of formula (I) and optionally the salt in water or an organic solvent.

13. A catalyst film for nonelectrode plating as in claim 12, wherein the compound of formula (I) is used in an amount of from about 1 to 50 wt. % based on the amount of solution.

14. A catalyst film for nonelectrode plating as in claim 12, wherein a solution formed by dissolving the compound of formula (I) in water or organic solvent further contains a binder and a monomer copolymerizable with the compound of formula (1).

15. A catalyst film for nonelectrode plating as in claim 1, wherein said Group IB or Group VIII metal atoms are present in the film in a sufficient quantity to function as a catalyst for nonelectrode plating by application of heat or irradiation with UV light.

16. A catalyst film for nonelectrode plating as in claim 1, comprising a base wherein the compound of formula (I) is present thereon in an amount of about 1 mg to 10 g per square meter of the base.

17. A catalyst film for nonelectrode plating as in claim 16, wherein said amount is about 20 mg to 1 g per square meter of the base.

18. A catalyst film for nonelectrode plating as in claim 16, wherein the polymer film thickness on the base is from about 0.001 to 5 um.

19. A catalyst film for nonelectrode plating as in claim 18, wherein said thickness is from about 0.05 to 0.5 um.

20. A catalyst film for nonelectrode plating as in claim 16, wherein the Group IB or Group VIII metal atom or a salt thereof, or a complex thereof, contained in the film is present in an amount of from about 5 to 5,000 parts by weight per 100 parts by weight of the polymer.

21. A catalyst film for nonelectrode plating as in claim 20, wherein said amount is from about 10 to 500 parts by weight per 100 parts by weight of the polymer.

22. A catalyst film for nonelectrode plating as in claim 15, wherein said metal functioning as a catalyst nuclei is a noble metal.

23. A catalyst film for nonelectrode plating as in claim 22, wherein said noble metal is selected from the group consisting of copper, silver, gold, palladium and platinum.

24. A catalyst film for nonelectrode plating as in claim 1, wherein said salt is selected from the group consisting of silver nitrate, palladium chloride, cuprous chloride and platinum chloride.

* * * * *